(12) United States Patent
Aouini et al.

(10) Patent No.: US 10,855,380 B2
(45) Date of Patent: Dec. 1, 2020

(54) CLOCK RECOVERY CIRCUITS, SYSTEMS AND IMPLEMENTATION FOR INCREASED OPTICAL CHANNEL DENSITY

(71) Applicant: Ciena Corporation, Hanover, MD (US)

(72) Inventors: Sadok Aouini, Gatineau (CA); Bilal Riaz, Stittsville (CA); Naim Ben-Hamida, Nepean (CA); Lukas Jakober, Ottawa (CA); Ahmad Abdo, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/270,203

(22) Filed: Feb. 7, 2019

(65) Prior Publication Data
US 2019/0190617 A1    Jun. 20, 2019

Related U.S. Application Data

(63) Continuation of application No. 15/795,676, filed on Oct. 27, 2017, now Pat. No. 10,243,671.

(51) Int. Cl.
| | | |
|---|---|---|
| *H04B 10/61* | (2013.01) | |
| *H04B 10/572* | (2013.01) | |
| *H04B 10/60* | (2013.01) | |
| *H03L 7/23* | (2006.01) | |
| *H04L 7/033* | (2006.01) | |

(Continued)

(52) U.S. Cl.
CPC ......... *H04B 10/6165* (2013.01); *H03L 7/081* (2013.01); *H03L 7/087* (2013.01); *H03L 7/093* (2013.01); *H03L 7/099* (2013.01); *H03L 7/235* (2013.01); *H04B 10/572* (2013.01); *H04B 10/60* (2013.01); *H04B 10/6163* (2013.01); *H04B 10/6164* (2013.01); *H04B 10/697* (2013.01); *H04L 7/0087* (2013.01); *H04L 7/033* (2013.01);

(Continued)

(58) Field of Classification Search
CPC .............. H04B 10/6165; H04B 10/572; H04B 10/6163; H04B 10/6164; H04B 10/60; H04B 10/697; H04L 7/033; H04L 7/0087; H04L 7/0335; H03L 7/087; H03L 2207/06

See application file for complete search history.

(56) References Cited

U.S. PATENT DOCUMENTS

| | | |
|---|---|---|
| 7,492,195 B1 | 2/2009 | Patil et al. |
| 7,742,507 B1 | 6/2010 | Kurowski et al. |

(Continued)

FOREIGN PATENT DOCUMENTS

EP        3217559 A1     9/2017

OTHER PUBLICATIONS

Eiselt et al., Contribution of Timing Jitter and Amplitude Distortion to XPM System Penalty in WDM Systems, IEEE Photonics Technology Letters, vol. 11, No. 6, Jun. 1999, pp. 748-750.

(Continued)

*Primary Examiner* — Syed Haider
(74) *Attorney, Agent, or Firm* — Clements Bernard Walker; Lawrence A. Baratta, Jr.; Christopher L. Bernard

(57) ABSTRACT

Techniques and circuits are proposed to increase averaging in the clock recovery band based on an amount of channel overlap in receivers using excess bandwidth for clock recovery, to mitigate the impact of spectral energy leaking into an active channel of interest from an adjacent active channel and to improve the accuracy of the phase estimate of the received transmitted clock.

19 Claims, 10 Drawing Sheets

(51) Int. Cl.
  *H03L 7/099* (2006.01)
  *H04B 10/69* (2013.01)
  *H04L 7/00* (2006.01)
  *H03L 7/087* (2006.01)
  *H03L 7/093* (2006.01)
  *H03L 7/081* (2006.01)

(52) U.S. Cl.
  CPC ........ *H03L 2207/06* (2013.01); *H04L 7/0335* (2013.01)

(56) References Cited

U.S. PATENT DOCUMENTS

| | | | | |
|---|---|---|---|---|
| 8,384,452 B1* | 2/2013 | Parker | ...................... | H03L 7/07 327/147 |
| 9,225,430 B2 | 12/2015 | Harley et al. | | |
| 2002/0037065 A1* | 3/2002 | Nakamura | ............. | H03L 7/087 375/375 |
| 2006/0024062 A1 | 2/2006 | Jakober et al. | | |
| 2006/0256909 A1* | 11/2006 | On | .......................... | H04L 7/033 375/376 |
| 2008/0240230 A1* | 10/2008 | Oxman | ................ | H04N 5/4401 375/240.01 |
| 2009/0121749 A1 | 5/2009 | Roberts et al. | | |
| 2012/0288044 A1 | 11/2012 | Roberts et al. | | |
| 2013/0033293 A1 | 2/2013 | Zhang | | |
| 2014/0220920 A1* | 8/2014 | Fernando | ............. | H04B 1/0007 455/226.2 |
| 2014/0292388 A1* | 10/2014 | Mohajeri | ............... | H03L 7/1075 327/157 |
| 2015/0341041 A1* | 11/2015 | Balachandran | ......... | H03L 7/085 327/156 |
| 2017/0257106 A1 | 9/2017 | Park et al. | | |
| 2018/0278337 A1 | 9/2018 | Jensen et al. | | |
| 2018/0331818 A1 | 11/2018 | Aouini et al. | | |

OTHER PUBLICATIONS

Gardner, A BPSK/QPSK Timing-Error Detector for Sampled Receivers, IEEE Transactions on Communications, vol. COM-34, No. 5, May 1986, pp. 423-429.

Grigoryan et al., Calculation of Timing and Amplitude Jitter in Dispersion-Managed Optical Fiber Communications Using Linearization, Journal of Lightwave Technology, vol. 17, No. 8, Aug. 1999, pp. 1347-1356.

International Telecommunication Union, Terms and definitions for optical transport networks, ITU-T G.870/Y.1352, Telecommunication Standardization Sector of ITU, Nov. 2016, pp. 1-6.

Mar. 22, 2019, International Search Report issued for International Patent Application No. PCT/US2018/056851.

* cited by examiner

CLOCK RECOVERY CIRCUITS, SYSTEMS AND IMPLEMENTATION FOR INCREASED OPTICAL CHANNEL DENSITY

CROSS-REFERENCE TO RELATED APPLICATIONS

This invention is a continuation of U.S. patent application Ser. No. 15/795,676, filed Oct. 27, 2017, and entitled "CLOCK RECOVERY CIRCUITS, SYSTEMS AND IMPLEMENTATION FOR INCREASED OPTICAL CHANNEL DENSITY," the contents of which are incorporated by reference herein.

TECHNICAL FIELD

This invention relates to receivers in optical communications networks, and in particular to clock recovery circuits, systems and implementation for optical channel spacing in gridless optical wavelength division multiplexing.

BACKGROUND

In optical communications, FIG. 1A is a generic illustration of adjacent data channels in a fixed grid optical spectrum including guard bands between data channels. In fixed grid optical systems individual channels have equal spectral width as illustrated, whereas in gridless (also known as flex-grid, flexible grid) optical systems individual data channels have differing spectral widths as illustrated in FIG. 1B. When multiple data channels travel together sharing the same optical path from one source to the same destination, the channels are "packed" into one Network Media Channel (NMC) as defined in ITU-T G.870.

In practice, data channel width considerations account for electromagnetic signal propagation properties. Before being transmitted on an optical link, signals are shaped to minimize inter-symbol interference. An example of typical pulse shaping employed is referred to as "raised-cosine" with parameter β defining an amount of excess bandwidth employed. The frequency domain equation is as follows:

$$X_{rc}(f) = \begin{cases} T & 0 \leq |f| \leq \frac{1-\beta}{2T} \\ \frac{T}{2}\left\{1 + \cos\left[\frac{\pi T}{\beta}\left(|f| - \frac{1-\beta}{2T}\right)\right]\right\} & \frac{1-\beta}{2T} \leq |f| \leq \frac{1+\beta}{2T} \\ 0 & |f| > \frac{1+\beta}{2T} \end{cases} \quad (1)$$

FIG. 1C illustrates the corresponding resulting channel spectrum for different β. For certainty, pulse shaping is not limited to raised-cosine.

The excess bandwidth such as defined by β is employed by the transmitter to provide clock information along with the data in the channel. The receiver uses the information in the excess bandwidth to extract a data clock signal and to estimate clock jitter.

Regardless of use of channels in a fixed grid deployment or in a gridless deployment there is a need to increase bandwidth utilization in a fiber. In gridless systems increased bandwidth utilization seeks to increase channel density. In fixed grid systems bandwidth utilization can be increased by increasing channel width.

As channel width/density increases, data transmission in a channel is subject to interchannel interference from neighboring channels deployed over the same fiber. FIG. 1D illustrates a typical received signal power distribution of a data channel used as a reference for description purposes herein. While shape similarities with signal shaping at the transmitter illustrated in FIG. 1C are apparent, away from the data channel as received at the receiver, signal energy leaks into neighbor channels. The energy leaks primarily affect the area of excess bandwidth of a particular adjacent neighbor channel. Trailing signal power away from the reference channel distribution contributes to increased background noise in neighbor channels to the reference channel.

Increasing channel width into the guard bands causes the distribution of leaked channel power to overlap in the guard bands as is more apparent from FIG. 1A. As excess bandwidth in the guard bands is used for clock recovery at the receiver, spectral energy leaked from adjacent channels affects the integrity of the extracted data clock which manifests itself as an increase in clock jitter.

Typically, as illustrated in FIG. 1B guard bands are reserved to provide channel separation to limit interchannel interference. The reservation of the guard bands may be based on agreement between operators to provide interoperability.

From a data transport point of view, the guard bands illustrated in FIG. 1B are dead-bands on the edges of each NMC. Guard bands can take up to 6.25 GHz roll-off and as such take up valuable spectrum.

SUMMARY

In current implementations of optical communication systems, performance metrics (e.g. Optical Signal-to-Noise Ratio (OSNR)) are collected from data channels provisioned in a network. It is desired that network management processes take advantage of the performance metrics to optimize the addition of data transport capacity when new data channels are added in the network. Particularly in gridless deployments, the main goal is to increase channel density to fit more channels in the same C-band or in the C+L bands. Adaptively increasing channel density by controlling coherent receiver settings based on link conditions provides more agility in assigning traffic to NMC signals of various spectral widths.

The main objective of clock recovery at the receiver is to estimate the clock signal timing offset and compensate for the offset. Data converters at receivers are sensitive to degradations in Signal-to-Noise Ratio (SNR). For good performance clock timing of the Analog-to-Digital Converter (ADC) needs to be optimized at high frequencies. Signal processing is employed to compensate for optical channel interference.

Known receiver architectures typically use a combination of digital and analog components. Typical designs can be feedforward-based, feedback-based or a combination of both. With reference to FIG. 3A clock recovery at the optical receiver is achieved by directly controlling a receiver Voltage Controlled Oscillator (VCO) through a proportional/integral controller set to follow the transmitter clock signal as received at the receiver.

With reference to FIG. 3B, the clock recovery loop is built around a Phase Detector (PD) implemented in the digital processing domain, around VCO gain and filtering elements working together to reduce sources of noise. For example, the transmitter clock could be extracted at the receiver employing a Godard or a Gardner early-late error indicator extraction method using signal energy in the excess bandwidth to estimate the total phase noise. An example is described by F. M. Gardner in "A BPSK/QPSK timing-error detector for sampled receivers," IEEE Trans. Commun., vol. 34, pp. 423-429, May 1986. Signal errors are constrained by a control loop which adjusts the receiver sampling clock.

Clock jitter is a measure of an uncertainty in the sampling moment of high-speed ADCs at the receiver. Clock jitter is proportional to the standard deviation of the phase error of the extracted clock signal. Coherent receivers must tolerate two sources of jitter: optical signal propagation jitter and receiver PLL implementation specific jitter.

$$\text{Jitter(total)} = \text{Jitter(received signal)} + \text{Jitter(receiver)} \qquad (2)$$

Optical signal propagation jitter is due to: amplified spontaneous emission, chromatic dispersion and Kerr nonlinearity. Amplified spontaneous emission is induced by optical line amplifiers. The bulk part of chromatic dispersion needs to be compensated at the receiver before digitally recovering timing information. A certain residual chromatic dispersion tolerance is anticipated and comes with a penalty. Kerr nonlinearities such as self-phase modulation and cross-phase modulation have an effect on timing jitter. Details regarding Kerr nonlinearities are described by M. Eiselt, et al. in "Contribution of timing jitter and amplitude distortion to XPM system penalty in WDM systems," IEEE Photonics Technology Letters, vol. 11, no. 6, pp. 748-750, June 1999; and by V. S. Grigoryan, et al. in "Calculation of Timing and Amplitude Jitter in Dispersion-Managed Optical Fiber Communications Using Linearization," J. Lightwave Technol. 17, 1347-(1999).

The dominant sources of jitter in electronic components in both the transmitter and receiver clocks, are the VCO and charge pump. The VCO is subject to jitter accumulation which manifests itself as high phase noise at low frequency offsets with respect to the carrier frequency as depicted in FIG. 3C.

Assuming a perfect transmitter, other sources of jitter at the receiver are: thermal noise and flicker noise in clock buffers, internal aperture of the ADC, supply variation and electromagnetic coupling. The latter is due to the decrease in electronic channel lengths when circuits are integrated on the same substrate. Some jitter, or ripple effects, is caused by the closed loop control of the receiver PLL. The design of the loop filter order and bandwidth plays a major role in controlling the aggregate jitter induced at the receiver.

FIG. 2 illustrates a phase domain ($\phi_{dBc}$) spectral density (phase noise) variation of different received signal components as seen at the receiver aggregated into Tx signal phase noise, Rx VCO clock phase noise and adjacent channel interference dependent on channel spacing. Effective clock recovery bandwidth is also shown in dashed line as the programmable clock recovery bandwidth.

With respect to a traditional clock recovery system, receiver jitter is tightly coupled to VCO phase noise suppression at the receiver. This means that lowering the jitter of the transmitted clock (as perceived at the receiver) is of little consequence using a receiver VCO having a large inherent phase noise. This is illustrated in FIG. 2 in which the "Tx phase noise" curve is illustrated inwards from the "Rx phase noise" curve. Conversely, Rx phase noise is the sum of the Tx phase noise (as shaped by the clock recovery loop of the receiver, illustrated as the dashed curve) and the receiver internal phase noise. Good receiver VCO phase noise suppression is needed at the receiver to optimize the clock recovery bandwidth to suppress the energy leakage from adjacent channels. In FIG. 2 this is illustrated by "Rx phase noise" curve having a portion under the dashed curve which represents noise suppression. The part of the Rx phase noise curve outside the dashed curve highlights untracked jitter.

Ultimately, an inability to discern phase information of the data clock signal in turn results in the receiver failing to acquire clock synchronization. Failure to acquire clock synchronization leads to failure to recover data over the data channel.

In the context of optical gridless networks, cross-talk from adjacent channels is an extra source of linear noise (impairments). From FIG. 2 it can be seen that reducing guard bands can lead to the transmitted clock phase information getting buried under adjacent channel interference. Cross-talk from adjacent channels is a bigger of a challenge to overcome when clock recovery depends on excess bandwidth.

There is a need to improve synchronization acquisition while increasing optical channel density.

The solution proposed herein provides systems, circuits and methods providing a higher spectral efficiency by reducing guard spacing between data channels. It has been discovered that this can be done by lowering the effective clock recovery bandwidth without impacting the receiver PLL bandwidth.

Techniques and circuits are proposed for receivers using excess bandwidth for clock recovery, to increase averaging in the clock recovery band based on an amount of channel overlap. This is to mitigate the impact of spectral energy leaking into an active channel of interest from an adjacent active channel and to improve the accuracy of the phase estimate of the received transmitted clock.

In accordance with an aspect of the proposed solution there is provided an optical receiver comprising: a phase locked loop circuit including a voltage controlled oscillator providing a sampling signal for timing the sampling of a received signal via an analog-to-digital converter based on a reference signal generated by a receiver local reference clock, and a low pass filter configured to smooth out signal changes in the reference signal for reducing phase noise in the sampling signal; and a clock recovery loop circuit including a digital phase detector providing a first output phase difference signal indicative of phase differences between the received signal and the sampling signal, and a digital controller configured to filter the phase difference signal to provide a control signal, the control signal being employed to set a clock recovery bandwidth of the sampling signal.

In accordance with another aspect of the proposed solution there is provided a method of sampling a received signal in an optical receiver, the method comprising: obtaining a required optical signal-to-noise ratio for a data channel; obtaining clock information from transponders on the same link to find channel jitter based on the required optical signal-to-noise ratio; determining a clock recovery bandwidth parameter and a channel data bandwidth parameter; configuring a low pass filter in a phase locked loop circuit of the receiver in accordance with the channel data bandwidth parameter; and configuring a digital controller in a clock recovery loop circuit of the receiver in accordance with the clock recovery bandwidth parameter, wherein a requirement for high bandwidth to reject noise in a receiver voltage controlled oscillator is decoupled from a clock recovery bandwidth requirement.

In accordance with yet another aspect of the proposed solution there is provided a bandwidth utilization controller configured provision a data channel, the controller being configured to: obtain a required optical signal-to-noise ratio for a data channel; obtain clock information from transponders on the same link to find channel jitter based on the required optical signal-to-noise ratio; determine a clock recovery bandwidth parameter and a channel data bandwidth parameter; set a low pass filter in a phase locked loop circuit of a receiver in accordance with the channel data bandwidth parameter; and set a digital controller in a clock recovery loop circuit of the receiver in accordance with the clock recovery bandwidth parameter, wherein a requirement for high bandwidth to reject noise in a receiver voltage controlled oscillator of the receiver is decoupled from a clock recovery bandwidth requirement.

BRIEF DESCRIPTION OF THE DRAWINGS

The proposed solution will be better understood by way of the following detailed description of embodiments of the invention with reference to the appended drawings, in which.

DETAILED DESCRIPTION

The operating principles of the proposed solution are based on employing a clock recovery circuit that provides selection of a programmable clock recovery bandwidth such as to suppress the leakage of adjacent channels independently from adjusting phase noise suppression parameters of the receiver VCO. The objective is to optimize clock recovery bandwidth to filter out adjacent channel interference.

Figure 4A:
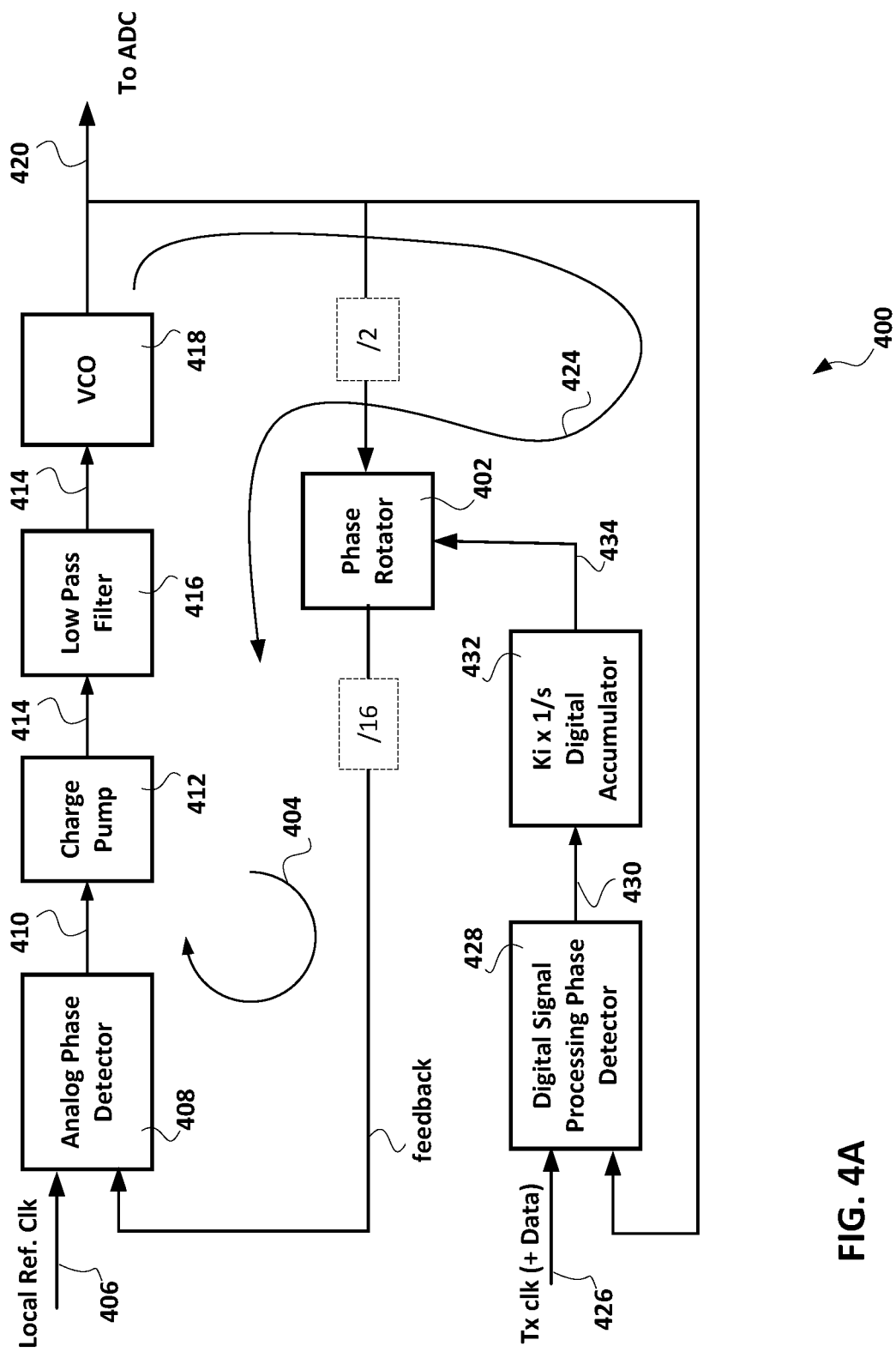
FIG. 4A is a circuit schematic diagram illustrating clock recovery employing a phase rotator in accordance with an embodiment of the proposed solution.

In accordance with one embodiment of the proposed solution such a clock recovery circuit 400 in a receiver employs a phase rotator 402 in the feedback path of an analog PLL as shown in FIG. 4A. The phase rotator 402 decouples the intrinsic VCO jitter phase noise suppression from the clock recovery.

An analog PLL 404 locks to a local reference clock 406 using an analog phase detector 408 providing a trigger signal 410 to charge pump 412. Charge pump 412 provides a voltage setting signal 414 to low pass filter 416. The low pass filter 416 is set to a high bandwidth to smooth out voltage signal 414 changes to reduce VCO phase noise in the output 420 of the VCO 418. The phase rotator-based clock recovery loop 424 (digital PLL) is nested in the analog PLL 404 and locks to the received data signal 426 using a digital phase detector 428. Received data signal 426 includes the transmitted clock signal information. The output 430 of the digital phase detector 428, which is representative of phase differences between the received data signal and the VCO output 420, is provided to digital accumulator 432. Digital codes 434 output by the digital accumulator 432 configure the phase rotator 402 to delay or advance the feedback signal in analog PLL loop 404. Phase rotator 402 can have a finer resolution when compared to total untracked RMS Jitter. The digital codes can be employed, for example through a functional dependency or through a look-up table, to correct non-linearity errors for example due to arctan and I-Q mismatch. Circuit 400 is configured to decouple the requirement for high bandwidth of the analog PLL 404 to reject the phase noise of the VCO 418 from the requirement of the clock recovery bandwidth. The phase rotator based digital clock recovery bandwidth provides improved jitter rejection in the received data signal versus VCO jitter generation and minimizes digital phase detector error through filtering/averaging (using the digital accumulator 432). The recovered data clock 420 is used to trigger an ADC to sample the received data signal 426. The configuration illustrated in FIG. 4A provides an optimization of VCO phase noise suppression using high bandwidth analog PLL 404 and the adjacent channel leakage into the clock recovery band by minimizing the clock recovery bandwidth.

Figure 4B:
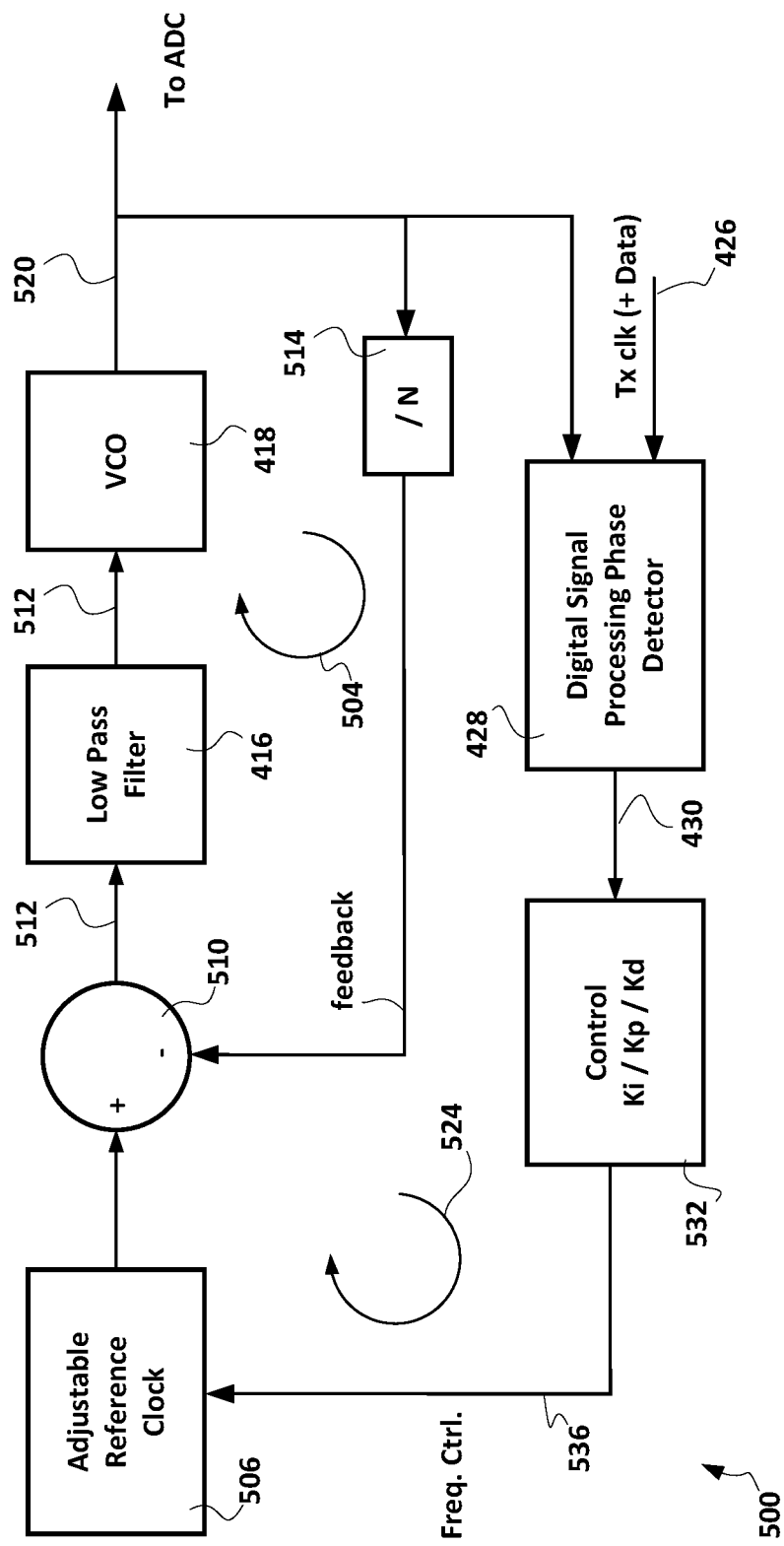
FIG. 4B is a circuit schematic diagram illustrating clock recovery employing an adjustable reference clock in accordance with another embodiment of the proposed solution.

In accordance with another embodiment of the proposed solution, another technique to reduce clock recovery bandwidth to filter out adjacent channel interference can for example adjust the reference clock of the receiver as illustrated in FIG. 4B. In circuit 500, an analog PLL feedback signal derived from the output 520 of the VCO 418 is combined at 510 with the output of an adjustable reference clock 506. The combined signal 512 is filtered by low pass filter 416 which sets a high bandwidth to smooth out driving signal 512 changes to reduce VCO phase noise in the output 520 of the VCO 418. Divider 514 provides the feedback signal of the analog PLL loop 504. A second digital PLL loop 524 compares the received data signal including the transmitted clock information 426 with the VCO output 520 using digital phase detector 428. The output 430 of the digital phase detector 428, which is representative of phase differences between the data signal and the VCO output 420, is provided to a digital controller 532. Output 536 of the digital controller 532 is used to provide digital PLL frequency control of the adjustable reference clock 506. Digital codes of the digital controller 532 configure adjustable reference clock 502 to output a lower or higher frequency to drive analog PLL loop 504. The digital codes can be employed, for example through a functional dependency or through a look-up table, to correct non-linearity errors for example due to arctan and I-Q mismatch. In this way, the adjustable reference clock can be regarded as a Numerically Controlled Oscillator (NCO) where the frequency control word 536 is provided by control block 532. Here again, this configuration provides an optimization of VCO phase noise suppression using the high bandwidth analog PLL 404 and the adjacent channel leakage into the clock recovery band by minimizing the bandwidth of the clock recovery loop 524.

While separate circuits are illustrated in FIGS. 4A and 4B, it is to be understood that hybrid circuits would also work.

Incidentally, it is noted that when measuring SNR, and assuming noise is uncorrelated with zero mean, averaging over N observations smooths out the result:

$$SNR_{averaged} = \frac{E[|\text{signal}|^2]}{\frac{E[|\sum \text{noise}|^2]}{N^2}} = \frac{E[|\text{signal}|^2]}{\frac{N*E[|\text{noise}|^2]}{N^2}} = N*SNR_{original}. \quad (3)$$

Figure 1A:
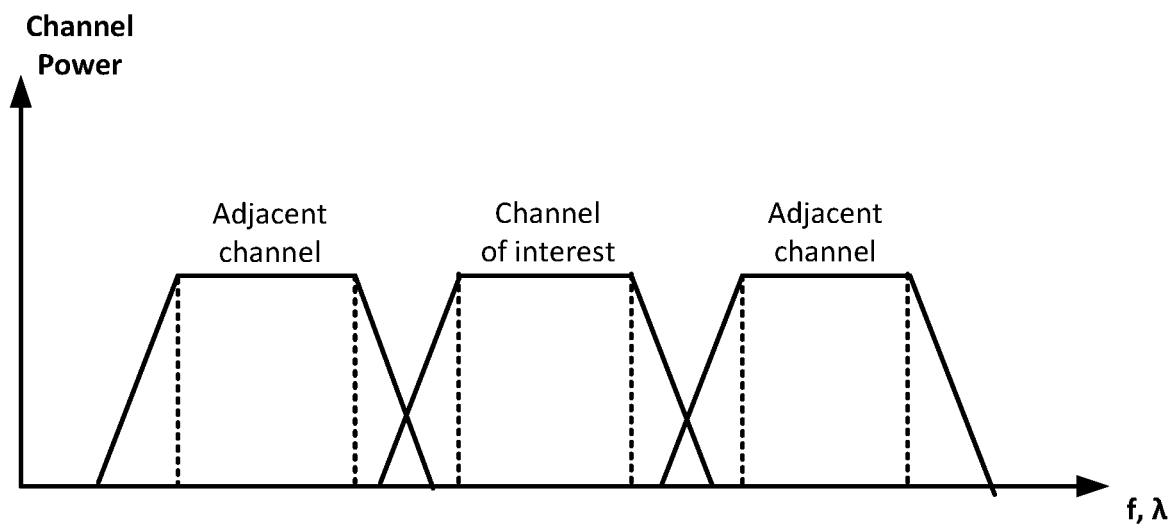
FIG. 1A is a schematic diagram illustrating generic adjacent channels in a fixed grid spectrum optical system.
Figure 1B:
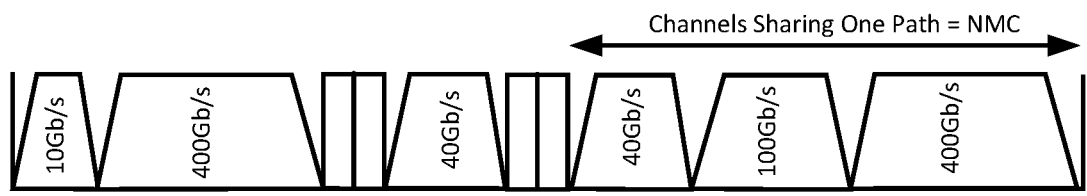
FIG. 1B is a schematic diagram illustrating an example of adjacent channels in a gridless spectrum optical system.
Figure 1C:
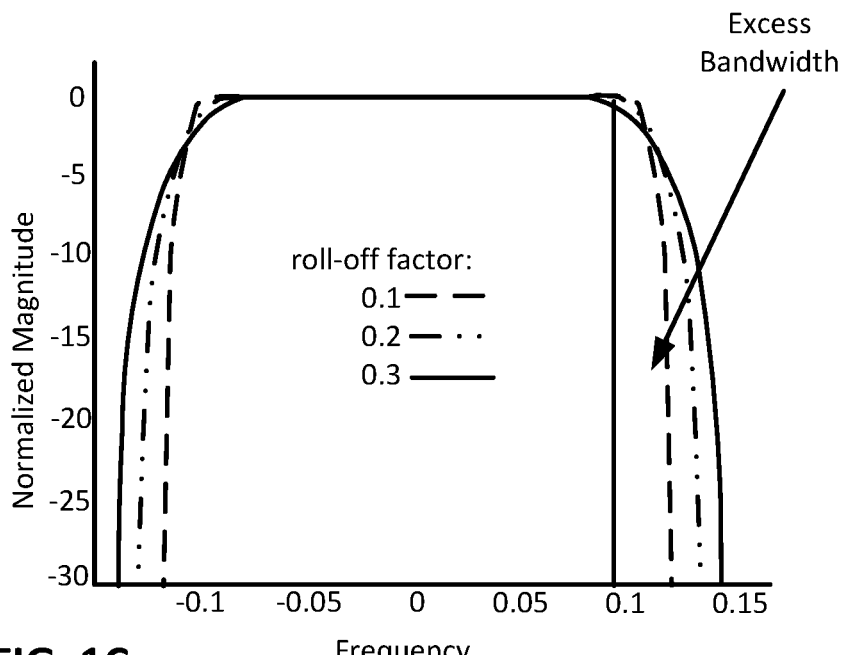
FIG. 1C is a schematic diagram illustrating pulse shaping for signal transmission in a data channel.
Figure 1D:
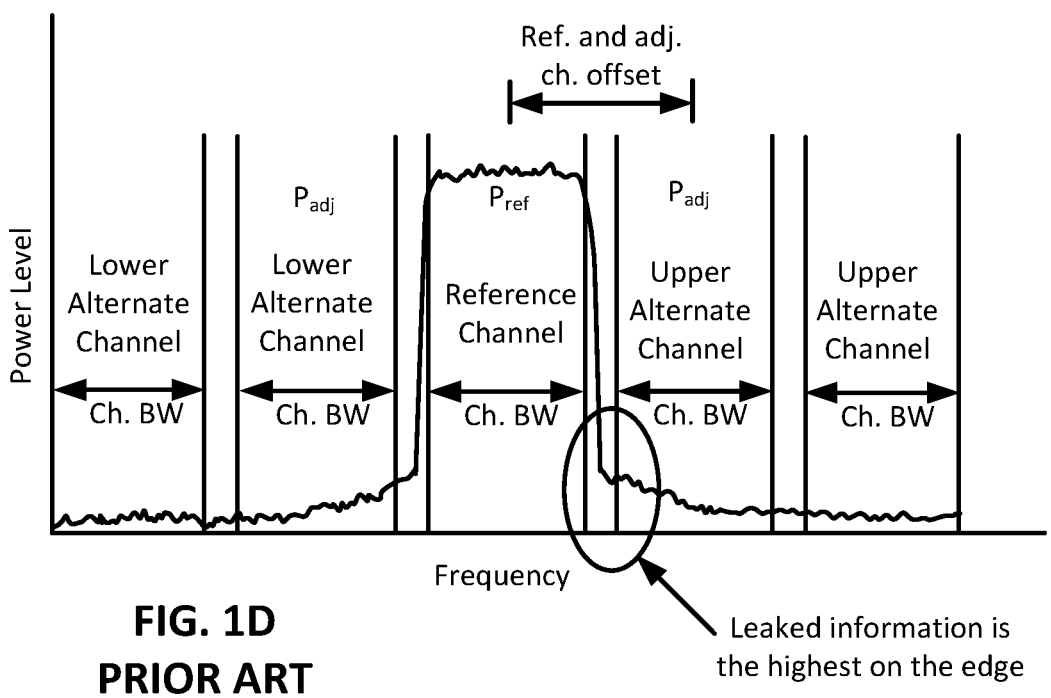
FIG. 1D is a schematic diagram illustrating received signal power distribution for an active data channel.
Figure 2:
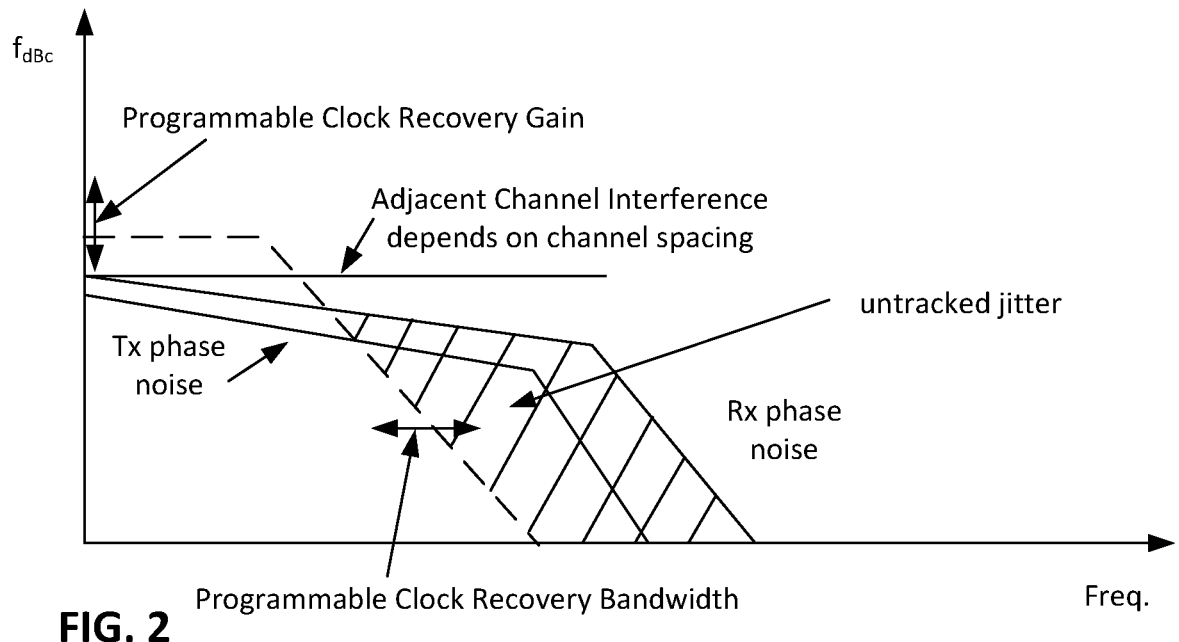
FIG. 2 is schematic diagram showing a phase domain ($\phi_{dBc}$) spectral density variation of different contributors at the receiver.
Figure 3C:
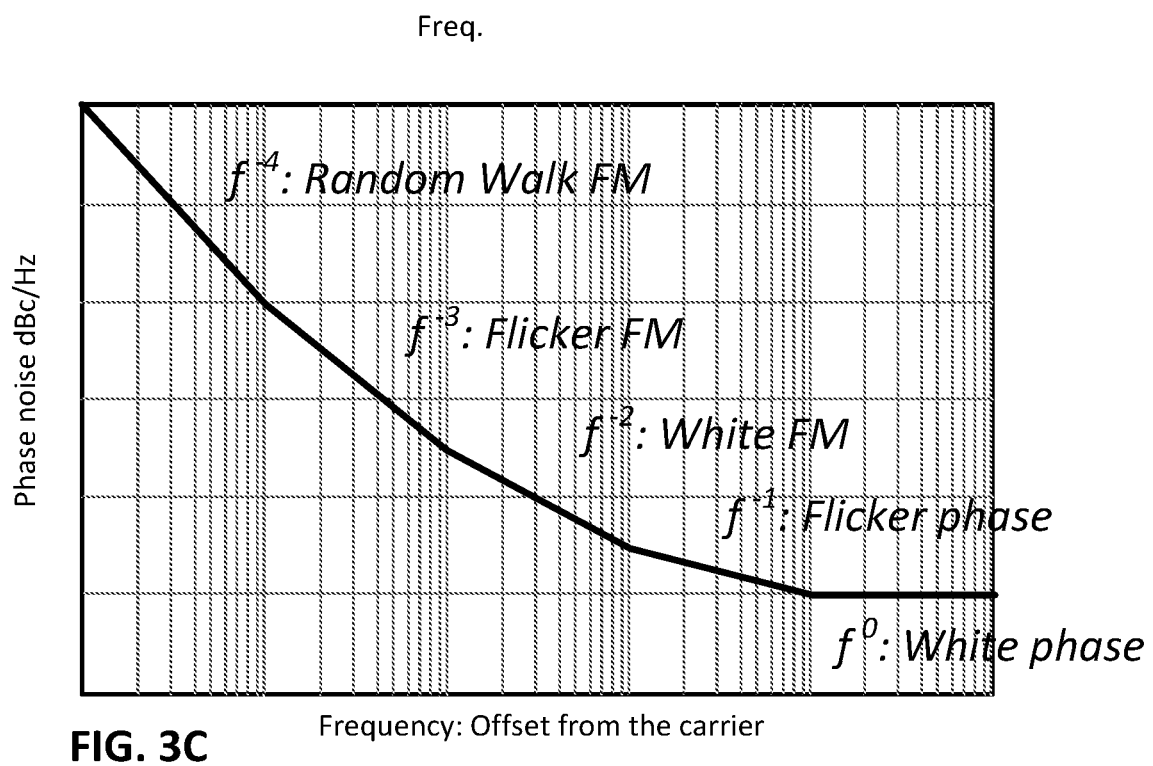
FIG. 3C is a schematic diagram showing phase noise variation with frequency in phase locked loops.
Figure 3A:
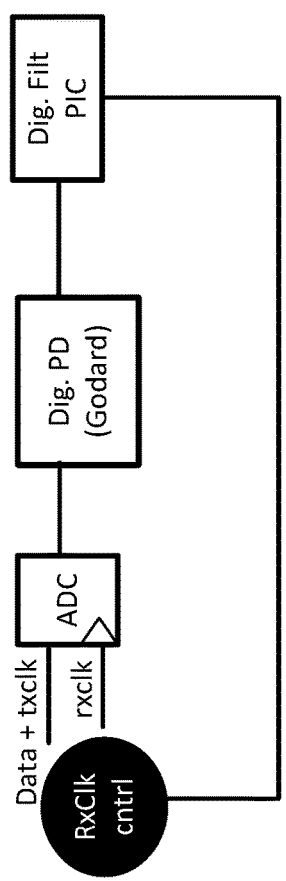
FIG. 3A is a circuit schematic for digital programming of a clock recovery in a feedback loop.
Figure 3B:
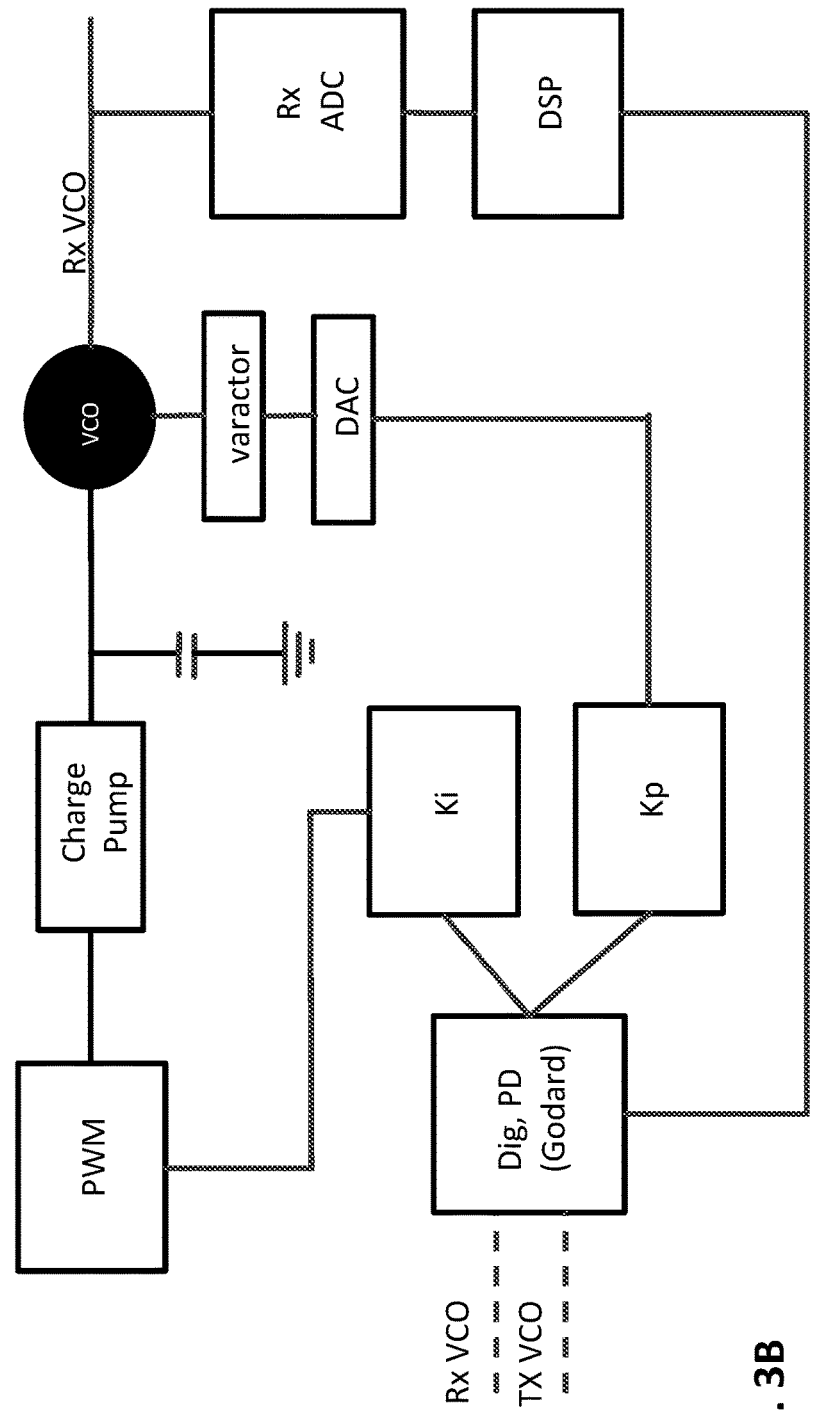
FIG. 3B is a circuit schematic illustrating legacy clock recovery wherein VCO jitter suppression is dependent on clock recovery bandwidth.

With reference to FIG. 2, lowering the clock recovery bandwidth effectively helps to filter out the impact of the adjacent channel interference and would provide better signal integrity with respect to transmitter clock extraction at the receiver. Such a system also requires signal transmission techniques to ensure that the transmitter jitter is low because lowering the clock recovery bandwidth limits the capability of tracking the transmitted clock at the receiver.

In addition, lowering the clock recovery bandwidth reduces the effective tracking by the receiver of the other sources of jitter. If we assume $J_{rx}$ (jitter induced by the receiver) is tracked by the receiver PLL, $J_{channel}$ can be estimated from neighboring channels in the same NMC. For the cases of low transmitter clock standard deviation in the total phase error ($J_{tx}$), the optimized parameters (bandwidth and gain) can be based on the specification in order to perform a fitting to extract optimal channel spacing. This can be summarized by:

$$J_{interference}(\text{spacing}) < J_{spec} - J_{channel} - J_{tx} - J_{rx} \quad (4).$$

Figure 5A:
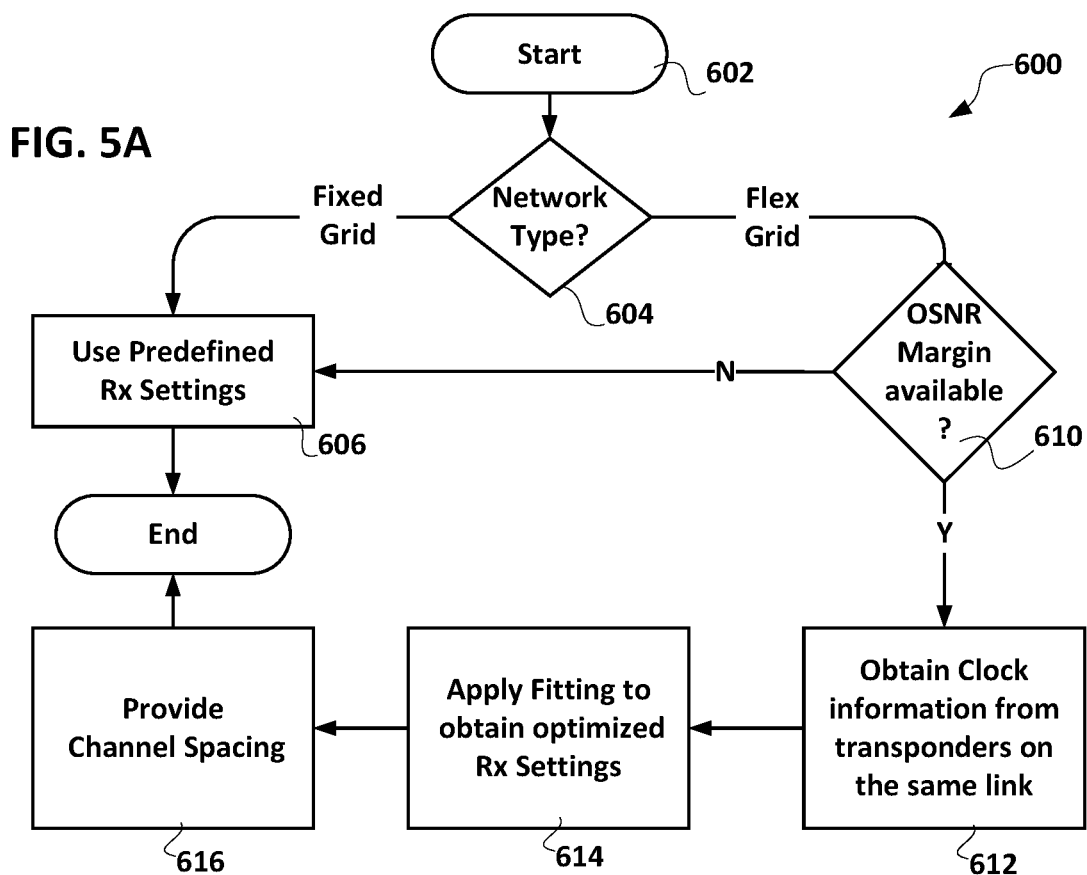
FIG. 5A is a schematic flow diagram illustrating a process for selecting receiver clock recovery bandwidth and gain in accordance with an embodiment of the proposed solution.

A process is proposed which takes into consideration phase noise induced by neighboring channels for programming the effective clock recovery bandwidth and gain of the channel of interest. Such a process is illustrated in FIG. 5A which can assess system penalty versus increasing bandwidth utilization based on optical network type. This methodology can be used to obtain Required Optical Signal-to-Noise Ratio (ROSNR) needed for a given channel capacity, for example through estimating channel spacing. The process 600 is initiated upon a request for new channel 602 with determining the optical network type 604. For a fixed grid optical system, predefined receiver settings can be employed to select 606 the clock recovery bandwidth, gain, Bit Error Rate (BER) and reduction in neighboring channel attenuation to permit channel width increase. However, if the network deployment includes a gridless optical system at 604, a brute force search method can be used to optimize parameters by adding a channel at nominal spacing predefined or at (1+β)*Baud-rate. Typical gridless deployments include channel spacing based on the granularity of the ROADMs, for example an integer multiple of 12.5 GHz.

Figure 5B:
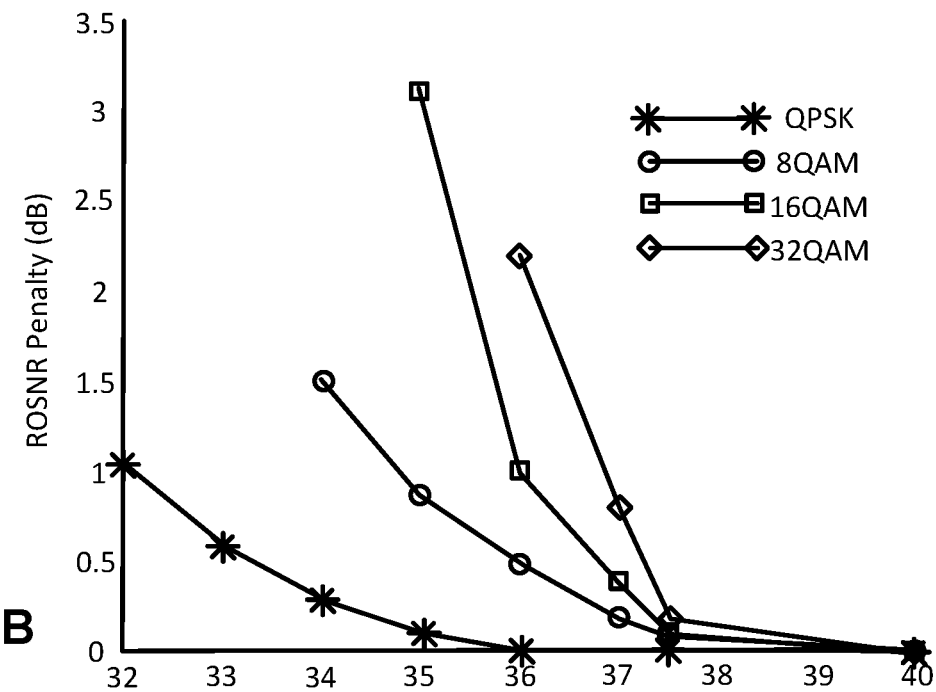
FIG. 5B is a graph illustrating simulated penalties for different modulation formats.

The impact of channel density on the ROSNR for different modulation formats typically used in commercial coherent modems was measured and a guideline can be provided regarding how jitter is affected by spacing and OSNR availability. Leaked energy from neighboring channels manifests itself as a form of noise added to the channel of interest, therefore the ROSNR to meet a Forward Error Correction (FEC) threshold will increase. FIG. 5B illustrates simulated penalties for different modulation formats to obtain the minimum available ROSNR required when increasing channel density. Deployments covering submarine links, long-haul, metro and data-center interconnects were investigated to be able to predict how ROSNR in link budget will be impacted by channel spacing.

From the graph of the measurements the penalty increases with the density of the constellation employed. Returning to the process illustrated in FIG. 5A, if no OSNR margin is available 610, the process resumes from step 606 employing predefined parameters as per ITU-T G.870. However, if OSNR margin is available, clock information can be obtained 612 in the gridless optical system from transponders typically on the same link.

Figure 5C:
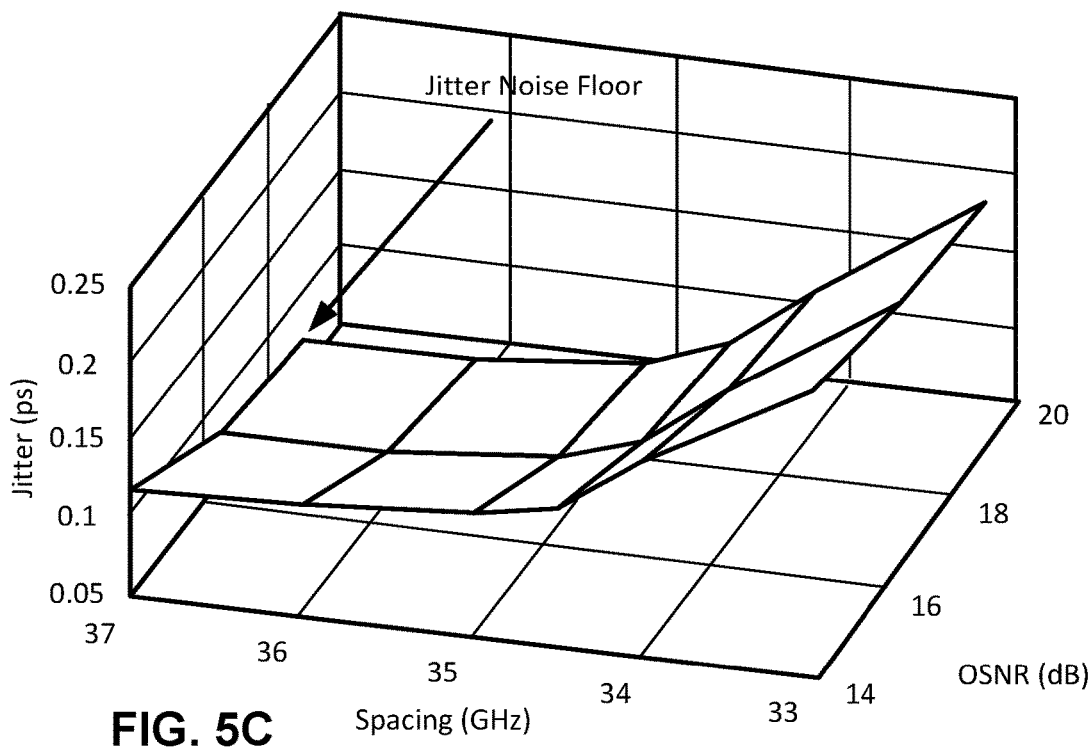
FIG. 5C is a graph illustrating a variation which is steeper versus channel spacing (right side of the graph) compared to changes in ASE noise level that is due to the high bandwidth phase noise induced in the jitter estimation (left side of the graph)

The Power Spectrum Distribution (PSD) of the generated phase noise of VCOs within a receiver PLL can be modelled as a Lorentzian distribution to associate channel density and OSNR with jitter margin. The linear effects of the noise source components mentioned hereinabove can be combined in a simulation, the results of which are illustrated in FIG. 5C. 0% margin is the point at which the receiver cannot reach steady state failing to synchronize to the transmitter clock at the receiver. FIG. 5C illustrates a variation which is steeper versus channel spacing (right side of the graph) compared to changes in ASE noise level that is due to the high bandwidth phase noise induced in the jitter estimation (left side of the graph). With this in mind, returning to FIG. 5A, a 2D sweep can be run 612 using receiver firmware (or a control processor) to obtain the optimized jitter based on the margin available by fitting to the variation illustrated in FIG. 5C. The optimization process results in identifying 614 a sweet spot for operating the receiver at optimal clock recovery parameters (clock recovery bandwidth) in terms of existing channel information (to cover untracked jitter and optical nonlinear effects) and OSNR margin (to cope with linear cross-talk penalty). Both discrete look-up table or continuous fitting can be used to translate a jitter margin (defined based on specifications associated with the transceiver) into channel spacing for known OSNR. Put another way, the variation in FIG. 5C is employed to provide channel spacing when the jitter margin is estimated from neighboring channels. The estimated jitter margin includes nonlinear impacts. The fitting is employed to predict channel spacing with a margin.

In a gridless deployment the clock recovery bandwidth can be set 616 in the receiver to optimize the channel spacing for a given OSNR target and squeeze the channel spacing. With reference to FIGS. 4A and 4B, the clock recovery bandwidth is set by adjusting low pass filter 416 parameters. Channel spacing can be set by specifying digital accumulator 432 or controller 532 parameters.

The process illustrated in FIG. 5A can be implemented in a bandwidth utilization controller, such as but not limited to: a receiver controller, line card controller, a network node controller, a link controller, a control plane controller, an optical system controller, centralized network controller, etc., via coded logic including, but not limited to: firmware, software, state machine logic, etc.

Figure 6A:
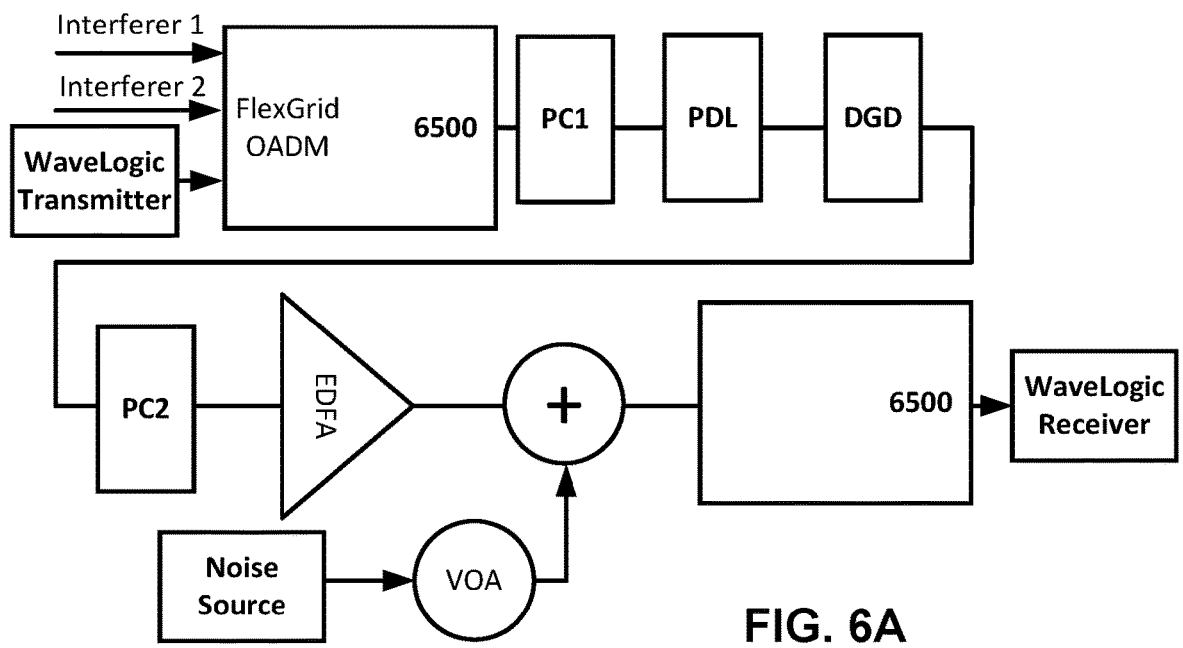
FIG. 6A is a schematic diagram illustrating an experimental setup in accordance with the proposed solution.

To demonstrate the validity of the method illustrated in FIG. 5A, a grid-less experimental setup was employed. The experimental setup takes into consideration fiber propagation effects and introduces controlled impairments as illustrated in FIG. 6A to quantitatively assess benefits. The experiment intentionally applied stress to the receiver (Wavelogic modem) to confirm the proposed optimization would be stable in real-life scenarios. Multiple channels were mixed onto an optical fiber using gridless settings typically employed in deployments using Ciena 6500 ROADMs. The probe wavelength of interest was selected and coherent transceivers with programmable wavelength (adjustable lasers) were used to change channel spacing. Three channels were active with the center one being the probe and the other two channels as interferers. Operation at 35 GBaud was provided using three WaveLogic 3 transponders (100 G/150 G/200 G). To help mimic real fiber propagation, a polarization dependent loss emulator (PDL) and a differential group delay emulator (DGD) were used. A Variable Optical Attenuator (VOA) was used to control the amount of noise impairment provided by an ASE amplifier. The fiber spool was a few kilometers (but can be of any length as long as link budgeting is complied with). Polarization scramblers PC1, PC2 were employed to mix the transmitted polarizations. Measurement sweeps were performed over multiple Polarization Depended Loss (PDL), Differential Group Delay (DGD), State of Polarization rate (PC1/PC2) and OSNR values.

Figure 6B:
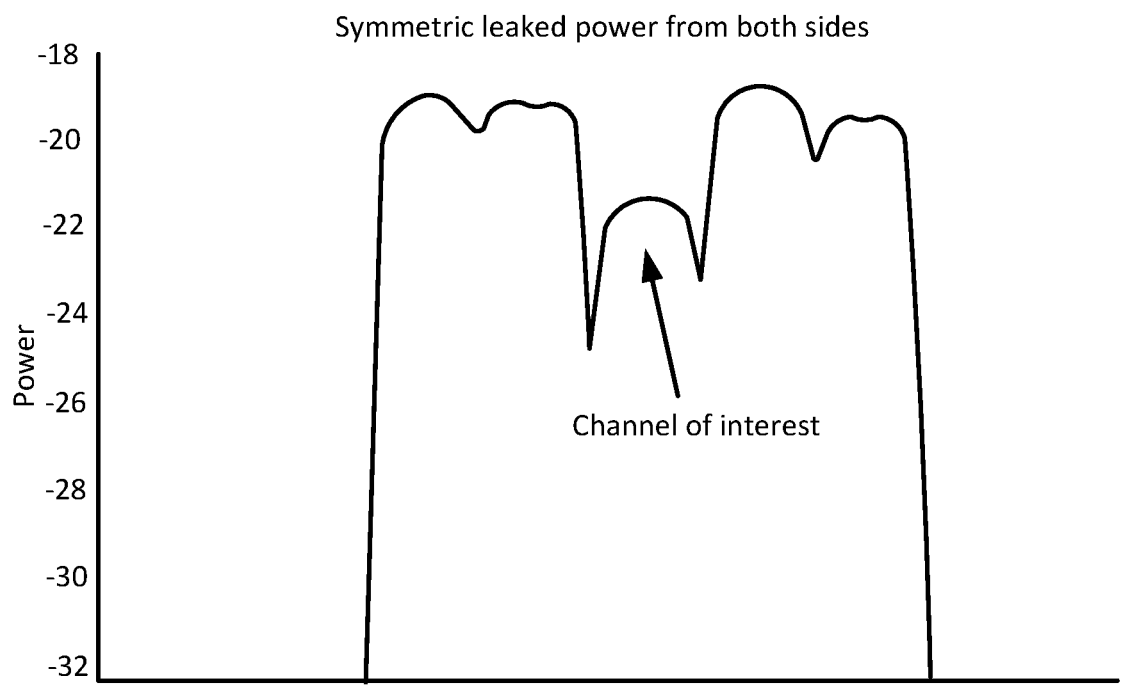
FIG. 6B is a schematic plot illustrating a measure power distribution of the tested channels in the experimental setup illustrated in FIG. 6A in accordance with the proposed solution.

FIG. 6B illustrates a measured power distribution of the tested channels. During typical use neighboring channels have similar power. Employing higher power neighboring channels was used to apply stress at the receiver. The testing method can be generalized to any type of neighboring channels.

Figure 6C:
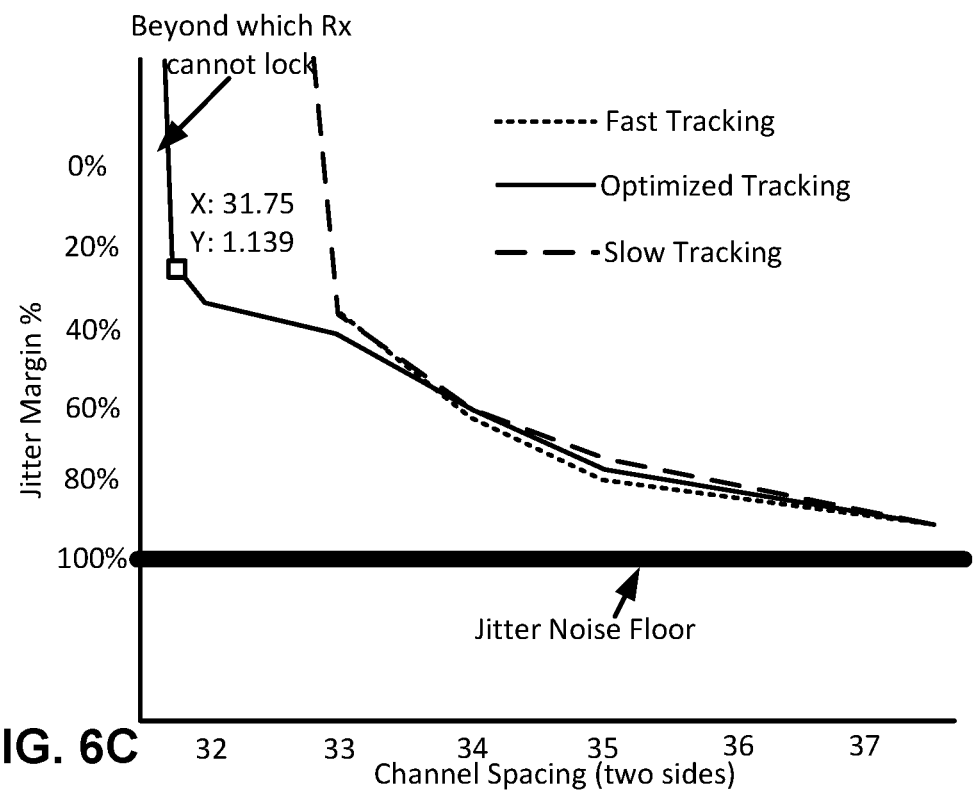
FIGS. 6C and 6D are schematic diagrams illustrating experimental results in accordance with the proposed solution, wherein similar features bear similar labels throughout the drawings.
Figure 6D:
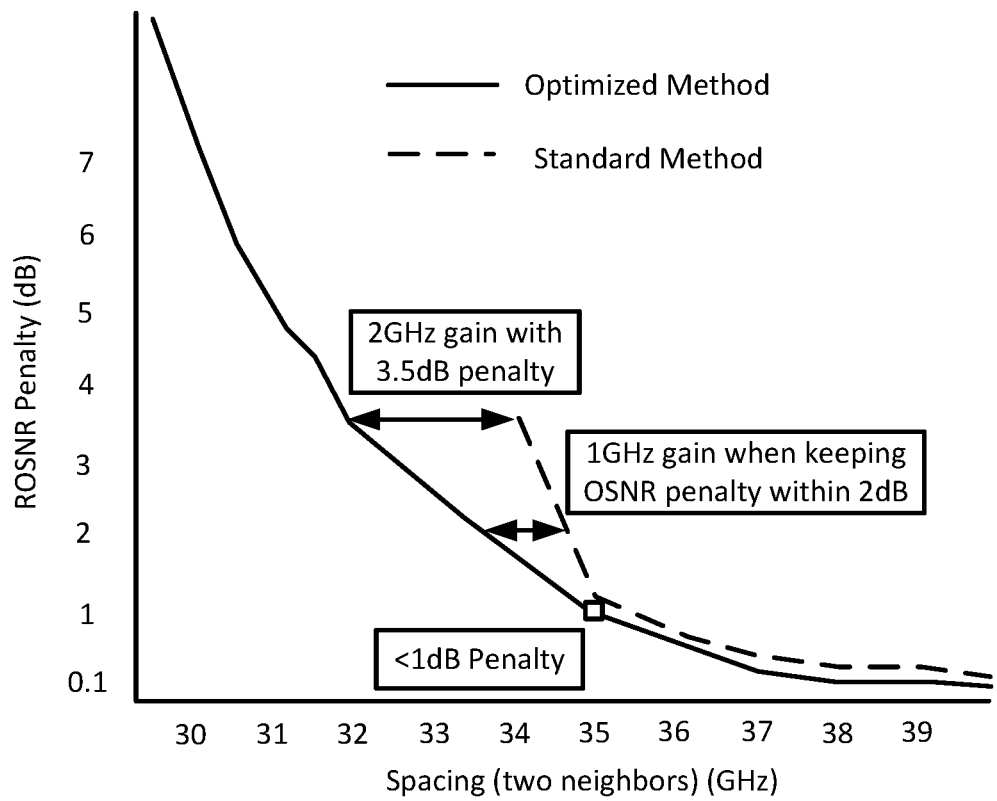

When trying to squeeze channels into a super-Nyquist mode of operation the penalty from linear cross-talk, looking like white noise, is apparent. The proposed method allowed for pushing the bounds at which receiver can carry traffic. The setup was able to operate without any errors with the same 2 dB OSNR penalty as non-optimal method but with 1 GHz less spacing as shown in FIGS. 6C and 6D. The experiment shows an ability to save about 10 to 20 GHz in the optical spectrum for each NMC.

It has been discovered that such a clock recovery scheme would benefit relaxing the stringent filtering requirements of the analog frontend when required in tight spacing applications, for example in submarine applications.

While the proposed solution has been described in detail with respect to increasing channel density in gridless deployments, the same circuits illustrated in FIGS. 4A and 4B can be employed to increase channel width in fixed grid deployments. In fixed grid deployments, increased Bit Error Rate (BER) can be tolerated at higher baud rates with a corresponding programmable lower neighboring channel attenuation being enforced (606) at the receiver by an optical filtering device such as a Wavelength Selective Switch (WSS) (not shown).

While the invention has been illustrated and described with reference to preferred embodiments thereof, it will be recognized by those skilled in the art that various changes in form and detail may be made therein without departing from the spirit and scope of the invention as defined by the appended claims.

What is claimed is:

1. A flexible grid optical receiver circuit comprising:
   a phase locked loop circuit configured to receive a received signal and to output a sampling signal based on timing of the received signal; and
   a clock recovery circuit configured to determine a phase difference between the received signal and the sampling signal, determine a control signal based on the phase difference, and utilize the control signal to set a clock recovery bandwidth of the phase locked loop circuit,
   wherein the clock recovery bandwidth is set to filter out adjacent channel interference, wherein the clock recovery bandwidth is set to optimize channel spacing of the received channel for a given optical signal-to-noise ratio, and wherein the clock recovery circuit is configured to estimate jitter margin from neighboring channels and to utilize the estimated jitter margin to set the optimized channel spacing.

2. The flexible grid optical receiver circuit of claim 1, wherein the received signal is in a super-Nyquist mode of operation.

3. The flexible grid optical receiver circuit of claim 1, wherein the clock recovery circuit includes a phase rotator configured to couple the phase locked loop circuit and the clock recovery loop circuit such that a feedback signal copy of the sampling signal is either delayed or advanced based on the control signal to filter out adjacent channel interference.

4. The flexible grid optical receiver circuit of claim 1, wherein the clock recovery circuit is configured to adjust a reference clock associated with the received signal.

5. The flexible grid optical receiver circuit of claim 4, wherein the reference clock has an adjustable frequency and the control signal is employed to control a frequency of the reference clock to filter out adjacent channel interference, and wherein the adjusted reference signal is combined with a feedback signal copy of the sampling signal.

6. A flexible grid optical system comprising:
   one or more flexible grid modems; and
   a bandwidth utilization controller communicatively coupled to the one or more flexible grid modems and configured to
      for a given optical signal-to-noise ratio target for a new channel on one of the one or more flexible grid modems, determine a required optical signal-to-noise ratio for the new channel;
      obtain estimated jitter margin from neighboring channels associated with the one or more flexible grid modems; and
      translate the estimated jitter margin into channel spacing for the new channel based on the given optical signal-to-noise ratio target.

7. The flexible grid optical system of claim 6, wherein a relationship between the estimated jitter margin and the channel spacing for the new channel based on the given optical signal-to-noise ratio target is predetermined.

8. The flexible grid optical system of claim 6, wherein the estimated jitter margin is translated to provide optimal clock recovery parameters in terms of existing channel information and the given optical signal-to-noise ratio target.

9. The flexible grid optical system of claim 6, wherein a flexible grid modem for the new channel includes
   a phase locked loop circuit configured to receive a received signal and to output a sampling signal based on timing of the received signal; and
   a clock recovery circuit configured to determine a phase difference between the received signal and the sampling signal, determine a control signal based on the phase difference, and utilize the control signal to set a clock recovery bandwidth of the phase locked loop circuit,
   wherein the clock recovery bandwidth is set to filter out adjacent channel interference.

10. The flexible grid optical system of claim 9, wherein the clock recovery bandwidth is set to optimize channel spacing of the received channel for a given optical signal-to-noise ratio.

11. The flexible grid optical system of claim 10, wherein the clock recovery circuit is configured to estimate jitter margin from neighboring channels and to utilize the estimated jitter margin to set the optimized channel spacing.

12. The flexible grid optical system of claim 9, wherein the received signal is in a super-Nyquist mode of operation.

13. The flexible grid optical system of claim 9, wherein the clock recovery circuit includes a phase rotator configured to couple the phase locked loop circuit and the clock recovery loop circuit such that a feedback signal copy of the sampling signal is either delayed or advanced based on the control signal to filter out adjacent channel interference.

14. The flexible grid optical system of claim 9, wherein the clock recovery circuit is configured to adjust a reference clock associated with the received signal.

15. The flexible grid optical system of claim 14, wherein the reference clock has an adjustable frequency and the control signal is employed to control a frequency of the reference clock to filter out adjacent channel interference, and
wherein the adjusted reference signal is combined with a feedback signal copy of the sampling signal.

16. A flexible grid optical receiver circuit comprising:
a phase locked loop circuit configured to receive a received signal and to output a sampling signal based on timing of the received signal; and
a clock recovery circuit configured to determine a phase difference between the received signal and the sampling signal, determine a control signal based on the phase difference, and utilize the control signal to set a clock recovery bandwidth of the phase locked loop circuit,
wherein the clock recovery bandwidth is set to filter out adjacent channel interference, wherein the clock recovery circuit is configured to adjust a reference clock associated with the received signal, and wherein the reference clock has an adjustable frequency and the control signal is employed to control a frequency of the reference clock to filter out adjacent channel interference, and wherein the adjusted reference signal is combined with a feedback signal copy of the sampling signal.

17. The flexible grid optical receiver circuit of claim 16, wherein the received signal is in a super-Nyquist mode of operation.

18. The flexible grid optical receiver circuit of claim 16, wherein the clock recovery circuit includes a phase rotator configured to couple the phase locked loop circuit and the clock recovery loop circuit such that the feedback signal copy of the sampling signal is either delayed or advanced based on the control signal to filter out adjacent channel interference.

19. The flexible grid optical receiver circuit of claim 16, wherein the clock recovery circuit is configured to adjust the reference clock associated with the received signal.

* * * * *